(12) United States Patent
Hosek

(10) Patent No.: US 6,990,430 B2
(45) Date of Patent: Jan. 24, 2006

(54) SYSTEM AND METHOD FOR ON-THE-FLY ECCENTRICITY RECOGNITION

(75) Inventor: Martin Hosek, Lowell, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/739,375

(22) Filed: Dec. 18, 2003

(65) Prior Publication Data

US 2004/0167743 A1 Aug. 26, 2004

Related U.S. Application Data

(60) Provisional application No. 60/435,552, filed on Dec. 20, 2002.

(51) Int. Cl.
*G06F 15/00* (2006.01)

(52) U.S. Cl. ...................................................... 702/155
(58) Field of Classification Search ................. 702/155; 33/520; 404/9; 414/783, 217, 800; 248/683; 700/275, 125, 218, 274, 121; 73/868; 356/73; 324/661; 451/9

See application file for complete search history.

(56) References Cited

U.S. PATENT DOCUMENTS

| 4,730,976 A | 3/1988 | Davis |
| 4,819,167 A | 4/1989 | Cheng |
| 4,880,348 A | 11/1989 | Baker |
| 5,238,354 A | 8/1993 | Volovich |
| 5,404,894 A | 4/1995 | Shiraiwa |
| 5,452,521 A * | 9/1995 | Niewmierzycki ............ 33/520 |
| 5,513,948 A | 5/1996 | Bacchi |
| 5,706,201 A | 1/1998 | Andrews |
| 5,765,983 A | 6/1998 | Caveney et al. |
| 5,882,413 A | 3/1999 | Beaulieu |
| 5,933,351 A | 8/1999 | Balamurugan ......... 364/468.28 |
| 6,002,840 A | 12/1999 | Hofmeister |
| 6,116,848 A | 9/2000 | Thomas |
| 6,198,976 B1 | 3/2001 | Sundar et al. ................. 700/59 |
| 6,208,751 B1 | 3/2001 | Almogy |
| 6,451,118 B1 | 9/2002 | Garriga |
| 6,468,022 B1 | 10/2002 | Whitcomb |
| 2003/0053904 A1 * | 3/2003 | Kirihata et al. ............. 414/783 |

OTHER PUBLICATIONS

International Search Report dated Apr. 14, 2005.

* cited by examiner

*Primary Examiner*—Michael Nghiem
*Assistant Examiner*—Tung S. Lau
(74) *Attorney, Agent, or Firm*—Perman & Green, LLP; Richard Pickreign

(57) ABSTRACT

A method of substrate eccentricity detection includes includes determining at least three positions on a perimeter of a first substrate, grouping the at least three perimeter positions to define one or more circles, estimating a location of a center of the first substrate as the location of a center of a predetermined circle approximated from the at least three perimeter positions, and determining an eccentricity vector as a difference between the estimated location and a reference position on a substrate transport mechanism on which the first substrate rests.

39 Claims, 13 Drawing Sheets

Nomenclature:

xr = distance of right sensor from path of end-effector center xl = distance of left sensor from path of end-effector center.

xa = asymmetry of sensors, xa = (xr-xl)/2 x1 = x-component of wafer eccentricity in case 1 x2 = x-component of wafer eccentricity in case 2

SYSTEM AND METHOD FOR ON-THE-FLY ECCENTRICITY RECOGNITION

This application claims the benefit of U.S. Provisional Application No. 60/435,552, filed Dec. 20, 2002.

BACKGROUND OF THE INVENTION

1. Field of the Invention

The present invention relates to a system and method for substrate detection and, more particularly, to substrate eccentricity detection.

2. Brief Description of Related Developments

Typical manufacturing processes for semiconductor integrated circuits may utilize robotic manipulators to cycle substrates, for example, circular silicon wafers, through pre-determined sequences of operations in fully automated processing equipment. Substrates may be delivered to the substrate processing equipment, also referred to as a tool, in standard transportation cassettes which house a batch of substrates stored in horizontal slots. Individual substrates may then be transferred from the cassettes by a specialized pick-place robot which may be integrated into the tool. Typically, the robot holds a substrate by means of frictional force between the backside of the substrate and an end-effector. In some applications, the force may be supplemented by a controlled suction-cup gripper.

As a result of limited, but not negligible, motion of the substrates in the cassettes during transportation, the robot may pick the substrate with undesirable eccentricity or misalignment. The difference between the actual location of the center of the substrate and the specified position on the robot end-effector needs to be corrected before the substrate can be processed in the tool. Existing methods and devices for determination and correction of eccentricity or misalignment of circular substrates may include stationary aligners, aligners built into the robot end effector, and external sensors.

When utilizing a stationary aligner, a robot places the substrate on a chuck of a stationary rotating device which rotates the substrate while scanning its edge for a fiducial location and substrate eccentricity. The aligner then moves the substrate to a centered position or transmits the resulting eccentricity vector to the robot which utilizes this information to pick the substrate in a centered manner. This approach introduces undesirable delays associated with the additional pick-place operations and with the edge-scanning process, all of which are executed sequentially rather than in an on-the-fly manner. It also undesirably increases the overall complexity and cost of the system.

An aligner may be integrated into the robot end-effector that mechanically centers the substrate and then scans its edge for fiducial location. The aligning process may take place on the fly during a regular substrate transfer operation, which can improve throughput performance. However, the mass and complexity of the moving components of the robot arm increases undesirably, which results in limited speed, compromised reliability and a higher cost.

Determination of substrate eccentricity using external sensors generally includes moving the substrate through a set of sensors which detect the leading and trailing edges of the substrate. The resulting information is processed to determine the actual location of the center of the substrate. The alignment process takes place on the fly during regular substrate transfer operations without increasing the mass or complexity of the robot arm. One example of the use of sensors for determining substrate eccentricity is disclosed by U.S. Pat. No. 5,706,201, issued on Jan. 6, 1998 to J. Randolph Andrews, entitled Software to Determine the Position of the Center of a Wafer. However, one disadvantage of this method is that it requires an array of multiple sensors.

It would be advantageous to provide a system for determining eccentricity or misalignment that includes a limited number of sensors to reduce cost and also overcomes the above mentioned disadvantages and other shortcomings of presently available systems.

SUMMARY OF THE INVENTION

In one embodiment, a method of substrate eccentricity detection is provided. The method includes determining at least three positions on a perimeter of a first substrate, grouping the at least three perimeter positions to define one or more circles, estimating a location of a center of the first substrate as the location of a center of a predetermined circle approximated from the at least three perimeter positions, and determining an eccentricity vector as a difference between the estimated location and a reference position on a substrate transport mechanism on which the first substrate rests.

In another embodiment, a method for determining the eccentricity of a first substrate is provided, including capturing a position of a mechanism transporting the first substrate upon detection of each of at least three points on a perimeter of the first substrate, compensating the captured positions for detection delays, and converting the transport mechanism positions to positions on the perimeter of the first substrate. The method also includes grouping the perimeter positions into trios, each trio defining a circle, estimating a location of a center of the substrate as the location of a center of a predetermined circle approximated from the perimeter positions, and determining an eccentricity vector as a difference between the estimated location and a reference position on the substrate transport mechanism.

In still another embodiment, a method for determining the eccentricity of a substrate includes displacing the substrate through a field of view of one or more sensors to detect at least three points on a perimeter of the substrate, capturing a position of a mechanism displacing the substrate upon detection of each of the at least three points, compensating the captured positions for detection delays, converting the transport mechanism positions to positions on the perimeter of the substrate, grouping the perimeter positions into trios, each trio defining a circle, estimating a location of a center of the substrate as the location of a center of a predetermined circle approximated from the perimeter positions, and determining an eccentricity vector as a difference between the estimated location and a reference position on the substrate transport mechanism.

In a further embodiment, a system for substrate eccentricity detection is provided. The system includes a substrate transport mechanism for transporting a first substrate along a path, at least one sensor for sensing points on a perimeter of the first substrate, and a controller connected to the substrate transport mechanism and to the at least one sensor. The controller is operable to determine at least three positions on the perimeter of the first substrate determined when the at least one sensor detects a perimeter of the first substrate, estimate a location of a center of the first substrate as the location of a center of a theoretical circle with a radius equal to a nominal radius which is approximated by a set of the at least three perimeter positions, and determine an eccentricity vector as a difference between the estimated location and a reference position on the substrate transport mechanism.

In yet another embodiment, a system for substrate eccentricity detection includes a substrate transport mechanism for transporting a substrate along a path, at least one sensor having a centerline positioned eccentric to the path for sensing points on a perimeter of the substrate, and a controller connected to the substrate transport mechanism and to the at least one sensor. The controller is operable to determine at least three positions on a perimeter of the substrate when the at least one sensor detects the perimeter of the first substrate, estimate a location of a center of the substrate as the location of a center of a theoretical circle with a radius equal to a nominal radius which is approximated by a set of the at least three perimeter positions, and determine an eccentricity vector as a difference between the estimated location and a reference position on the substrate transport mechanism.

BRIEF DESCRIPTION OF THE DRAWINGS

The foregoing aspects and other features of the present invention are explained in the following description, taken in connection with the accompanying drawings, wherein.

DETAILED DESCRIPTION OF THE DISCLOSED EMBODIMENT(S)

Figure 1:
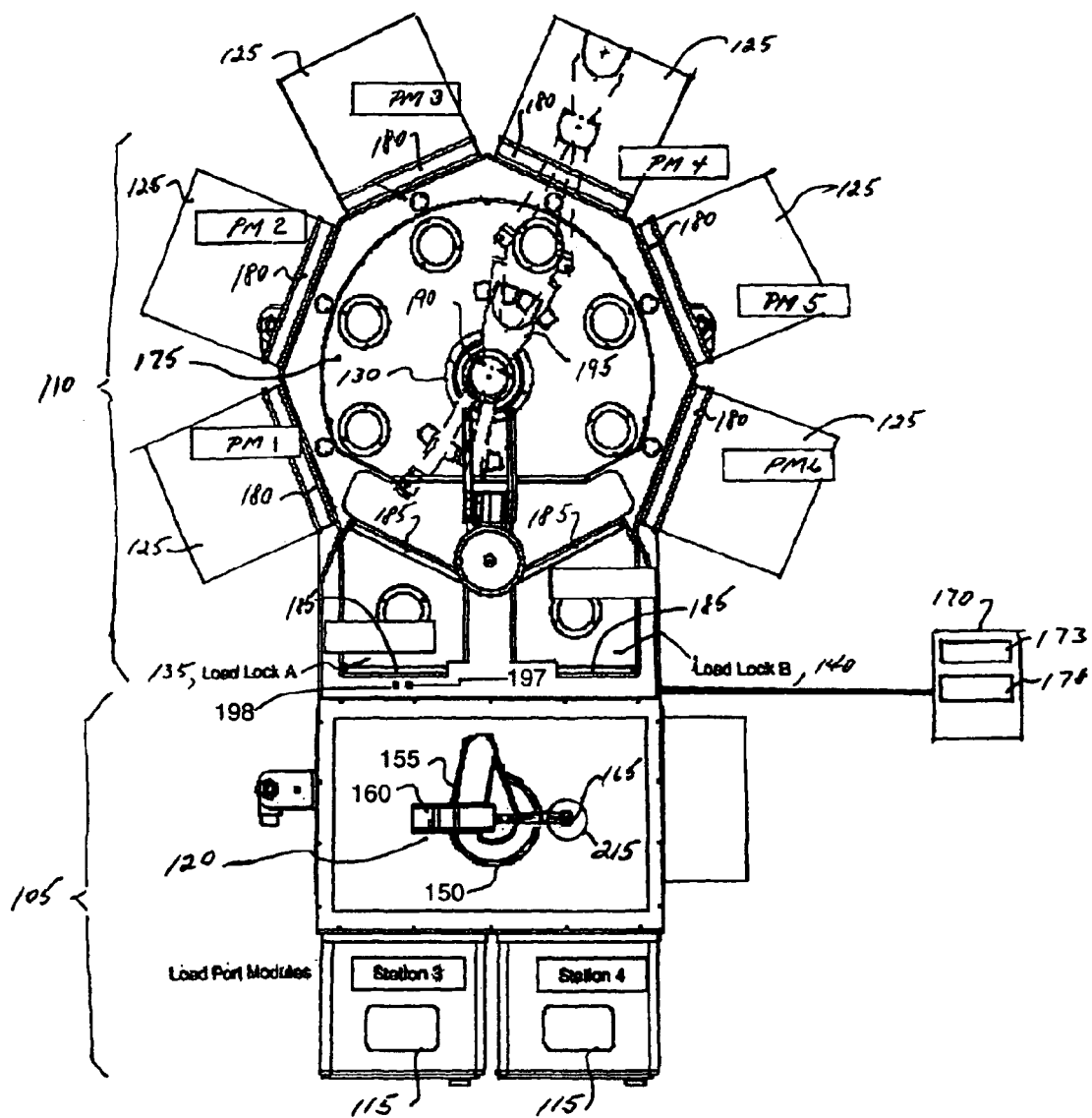
FIG. 1 is a plan view of a system incorporating features of the present invention.

Referring to FIG. 1, a plan view of a system, shown in this example as a substrate processing apparatus 100, incorporating features of the present invention is illustrated. Although the present invention will be described with reference to the embodiment shown in the drawings, it should be understood that the present invention can be embodied in many alternate forms of embodiments. In addition, any suitable size, shape or type of elements or materials could be used.

The present invention includes a substrate transport capability shown in FIG. 1 as one or more robot arms 120, 130 and a sensing capability shown in FIG. 1 as sensors 197, 198 and controller 170. The substrate transport capability 120, 130 and the sensing capability 197, 198 operate to provide for on-the-fly determination of eccentricity or misalignment of a substrate.

For purposes of this invention a substrate may be for example, a semiconductor wafer, any other type of substrate suitable for processing by substrate processing apparatus 100, a blank substrate, or an article having characteristics similar to a substrate, such as certain dimensions or a particular mass.

Also for purposes of this invention, eccentricity refers to the difference between the actual location of the center of a substrate and its desired position on an end effector of a robotic manipulator or robot arm. The robot arm may compensate for the difference between the substrate center location and its desired end effector position when performing a place operation, resulting in the substrate being placed in a centered position regardless of the amount and direction of the initial eccentricity.

One aspect of the invention includes a dual-sensor configuration for substrate eccentricity detection. Substrate eccentricity detection may be accomplished using two sensors positioned in optimized locations, advantageously reducing complexity and cost. Another aspect includes compensation for signal delays in the system. This compensation may utilize one or more velocities of the robot arm. Still another aspect of the invention includes substrate deviation detection, that is, detection of deviations from an expected contour of a substrate. This type of detection may be employed to abort or otherwise adjust operation of the one or more robot arms 120, 130. Yet another aspect of the invention includes feature detection to determine whether a known characteristic on the circumference of the substrate, for example an alignment fiducial, has passed through the sensors. A further aspect of the invention may also include determination of substrate eccentricity. This may be accomplished by using an algorithm based on least-square optimization. The algorithm may be designed specifically to work with the dual-sensor configuration mentioned above. Another aspect of the invention includes a calibration procedure to automatically determine the locations of the sensors, estimate the delays associated with the sensor signals, and set thresholds for deviation and feature detection.

Referring again to FIG. 1, substrate processing apparatus 100 generally has an atmospheric section 105, which is open to the atmosphere, and an adjoining vacuum section 110, which is equipped to function as a vacuum chamber.

Atmospheric section 105 typically has one or more substrate holding cassettes 115, and an atmospheric robot arm 120. Vacuum section 110 may have one or more processing modules 125, and a vacuum robot arm 130. Vacuum section 110 may also have one or more intermediate chambers, referred to as load locks. The embodiment shown in FIG. 1 has two load locks, load lock A 135, and load lock B 140. Load locks A and B operate as interfaces, allowing substrates to pass between atmospheric section 105 and vacuum section 110 without violating the integrity of any vacuum that may be present in vacuum section 110. Substrate processing apparatus 100 generally includes a controller 170 that controls the operation of substrate processing apparatus 100. Controller 170 has a processor and a memory 178.

Memory 178 may include programs including techniques for on-the-fly substrate eccentricity and misalignment detection and correction in accordance with the present invention.

Atmospheric robot arm 120, also referred to as an ATM robot, may include a drive section 150 and one or more arms 155. At least one arm 155 may be mounted onto drive section 150. At least one arm 155 may be coupled to a wrist 160 which in turn is coupled to an end effector 165 for holding a substrate 215. End effector 165 may be rotatably coupled to wrist 160. ATM robot 120 may be adapted to transport substrates to any location within atmospheric section 105. For example, ATM robot 120 may transport substrates among substrate holding cassettes 115, load lock A 135, and load lock B 140. Drive section 150 may receive commands from controller 170 and, in response, direct radial, circumferential, elevational, compound, and other motions of ATM robot 120.

Vacuum robot arm 130 may be mounted in central chamber 175. Controller 170 may operate to cycle openings 180, 185 and coordinate the operation of vacuum robot arm 130 for transporting substrates among processing modules 125, load lock A 135, and load lock B 140. Vacuum robot arm 130 may include a drive section 190 and one or more end effectors 195.

In other embodiments, ATM robot 120 and vacuum robot arm 130 may be any suitable type of transport apparatus, for example, a SCARA-type robot, an articulating arm robot, a frog leg type apparatus, or a bi-symmetric transport apparatus.

Dual Sensor Configuration

Figure 2:
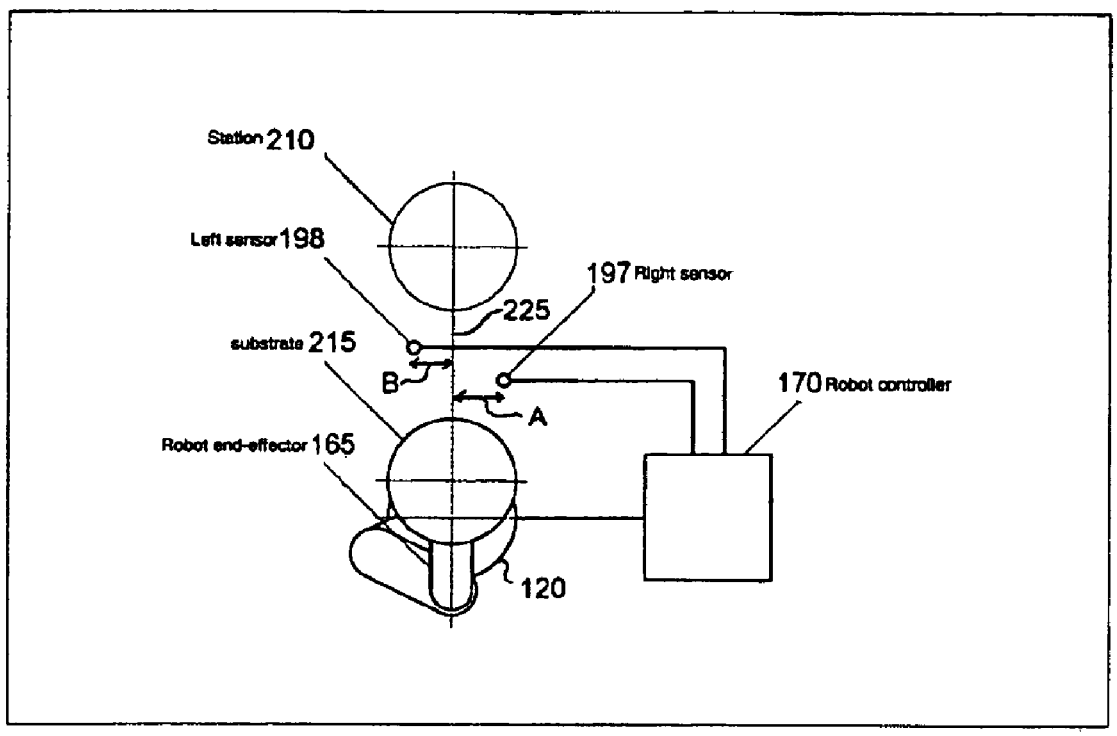
FIG. 2 shows an exemplary embodiment of a substrate transport and sensing capability.

FIG. 2 shows a schematic diagram of an exemplary embodiment of the substrate transport capability and sensing capability. This example shows ATM robot 120 as providing the substrate transport function, however, it should be understood that this function may be provided by vacuum robot arm 130 or any other substrate transport mechanism. In this embodiment, ATM robot 120 is shown as being operable to transfer substrate 215 along a transfer path 225 to a station 210. Station 210 may be a load lock 135, 140, a processing module 125, a cassette 115, or any other location or device of substrate processing apparatus 100 capable of supporting substrate 215.

A pair of sensors 197, 198 are located along the substrate transfer path 225 such that the distance between sensor 197 and transfer path 225, shown as distance A, and the distance between sensor 198 and transfer path 225, shown as distance B, are unequal. While distance A is shown as greater than distance B, it should be understood that distance A may be less than distance B, and that distances A and B have any value as long as they are unequal. In alternate embodiments additional sensors could be provided and the sensors could be located at any suitable location along transfer path 225, as long as they are able to detect substrate 215. Sensors 197, 198 may be any type of sensors appropriate for practicing the present invention, for example, through-beam or reflective optical sensors, infrared sensors, laser sensors, capacitive sensors or ultrasonic sensors.

While transfer path 225 is shown as a linear path, it may be a curved or any other shaped path.

Turning to FIGS. 3A–3F, as ATM robot 120 moves substrate 215 along transfer path 225, controller 170 captures the positions and velocities of end effector 165 as the edges of substrate 215 are detected by sensors 197, 198. Four distinct data sets may be obtained as the sensors 197, 198 detect the leading and trailing edges of substrate 215. These data sets along with an expected radius of substrate 215 and the coordinates of sensors 197, 198 may be used to determine the eccentricity of substrate 215 and/or for deviation and feature detection purposes.

The data sets may be processed using algorithms designed to accommodate substrates of different diameters and substrates with known deviations from a circular shape, such as alignment fiducials found on the circumference of standard silicon wafers. Compensation may be included to account for errors resulting from delays associated with the signals generated by sensors 197, 198.

The data sets and algorithms may yield an eccentricity vector which may be employed to achieve a centered substrate placement. The eccentricity vector may be used to calculate adjustments of the destination position for a place operation by ATM robot 120. The adjustments may be applied in an on-the-fly manner by modifying the existing trajectory of ATM robot 120 or may be applied through an additional motion to be executed once the existing trajectory has been completed. The automatic calibration aspect of the invention includes a procedure to determine the locations of sensors 197, 198, estimate the delays associated with the sensor signals, and set detection thresholds for detecting deviations and features of substrate 215.

Compensation for Signal Delays

The data sets mentioned above provide end effector position data, captured when the edges of substrate 215 are detected by sensors 197, 198. In practice, the position data may include errors. For example, there may be delays associated with the sensors 197, 198 generating signals, and delays in controller 170 recognizing that the signals have occurred. These errors may be particularly significant in high-speed/high-accuracy applications where end effector 165 may travel undesirably long distances during the time from the edge of the substrate entering the field of view of sensor 197, 198 and the controller actually recognizing that such an event has occurred, referred to herein as the sensing time.

In order to estimate the direction and length of motion of end effector 165 during the sensing time, end effector velocity and position data are captured at the time of edge detection. The captured velocity data is used to construct a velocity vector. The direction and magnitude of the velocity vector are used to determine the instantaneous direction and speed of motion of end effector 165. Assuming that the direction and speed of motion of end effector 165 remain substantially constant during the sensing time, and provided that the time elapsed is equal to a known time delay, the motion of end effector 165 during the sensing time can be reconstructed to obtain an estimate of the actual position of the end-effector when a particular edge of substrate 215 enters the field of view of sensor 197, 198.

Figures 3A, 3B, 3C, 3D, 3E, 3F:
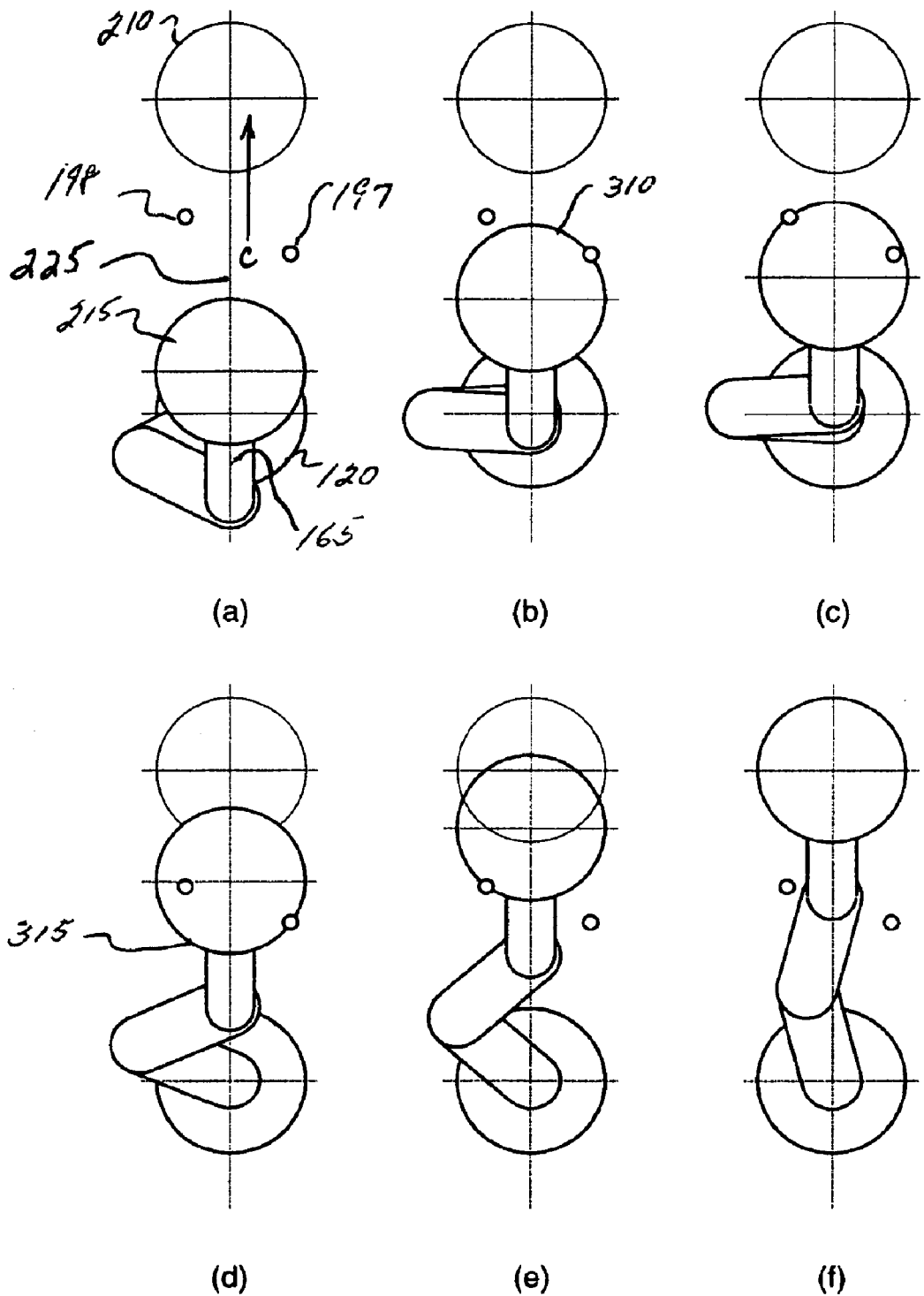
FIGS. 3A–3F show the operation of a system according to the present invention.

The motion reconstruction process may be performed for each data set, for example, when the sensor 197 detects a leading edge 310 of substrate 215 (FIG. 3B), when sensor 198 detects the leading edge 310 of substrate 215 (FIG. 3C), when sensor 197 detects a trailing edge 315 of substrate 215 (FIG. 3D), and when sensor 198 detects the trailing edge 315 of substrate 215 (FIG. 3E).

The symbols used in the equations related to the present invention are defined in Table 1 below.

TABLE 1

| Symbol | Description | Unit of measure |
|---|---|---|
| r | radius of substrate | (m) |
| $R_{adj}$ | R-coordinate of adjusted destination position of end-effector | (m) |
| $R_{stn}$ | R-coordinate of robot station | (m) |
| $R_i$ | actual R-coordinate of end-effector when sensor detects edge of substrate♣ | (m) |
| $\tilde{R}_i$ | captured R-coordinate of end-effector when sensor detects edge of substrate (delayed reading)♣ | (m) |
| $T_{adj}$ | T-coordinate of adjusted destination position of end-effector | (rad) |
| $T_{stn}$ | T-coordinate of robot station | (rad) |
| $T_i$ | actual T-coordinate of end-effector when sensor detects edge of substrate♣ | (rad) |
| $\tilde{T}_i$ | captured T-coordinate of end-effector when sensor detects edge of substrate (delayed reading)♣ | (rad) |
| $v_{Ri}$ | R-component of end-effector velocity when sensor detects edge of substrate♣ | (m/s) |
| $v_{Ti}$ | T-component of end-effector velocity when sensor detects edge of substrate♣ | (rad/s) |
| $v_{xi}$ | x-component of end-effector velocity when sensor detects edge of substrate♣ | (m/s) |
| $v_{yi}$ | y-component of end-effector velocity when sensor detects edge of substrate♣ | (m/s) |
| $x_A$ | asymmetry of sensors measured in x-direction, $x_A = (|x_{SR}| - |x_{SL}|)/2$ | (m) |
| $x_D$ | distance between sensors measured in x-direction, $x_D = |x_{SR}| + |x_{SL}|$ | (m) |
| $x_S$ | distance of sensor from desired path of end-effector center | (m) |
| $x_{SL}$ | x-coordinate of left sensor ($|x_{SL}|$ is distance of left sensor from desired path of end-effector) | (m) |
| $x_{SR}$ | x-coordinate of right sensor ($|x_{SR}|$ is distance of right sensor from desired path of end-effector) | (m) |
| $x_i$ | actual x-coordinate of end-effector when sensor detects edge of substrate♣ | (m) |
| $\tilde{x}_i$ | captured x-coordinate of end-effector when sensor detects edge of substrate (delayed reading)♣ | (m) |
| $y_{SL}$ | y-coordinate of left sensor | (m) |
| $y_{SR}$ | y-coordinate of right sensor | (m) |
| $y_i$ | actual y-coordinate of end-effector when sensor detects edge of substrate♣ | (m) |
| $\tilde{y}_i$ | captured y-coordinate of end-effector when sensor detects edge of substrate (delayed reading)♣ | (m) |
| $\Delta_E$ | total substrate eccentricity error | (m) |
| $\Delta_S$ | sensor resolution | (m) |
| $\Delta_x$ | reading error (resolution) in x-direction | (m) |
| $\Delta_y$ | reading error (resolution) in y-direction | (m) |
| $\epsilon$ | accuracy of gradient method | (m) |
| $\epsilon_{break}$ | deviation (defect, breakage) detection threshold | (m) |
| $\epsilon_{notch}$ | feature (fiducial, notch) detection threshold | (m) |
| $\eta_o$ | η-component of substrate eccentricity | (m) |
| $\eta_i$ | η-coordinate of point on substrate edge detected by sensor♣ | (m) |
| $\xi_o$ | ξ-component of substrate eccentricity | (m) |
| $\xi_i$ | ξ-coordinate of point on substrate edge detected by sensor♣ | (m) |
| $\tau_i$ | delay associated with detection of edge of substrate by sensor♣ | (s) |

♣Where index i refers to edge detection events: i = 1, leading edge detected by left sensor, i = 2, trailing edge detected by left sensor, i = 3, leading edge detected by right sensor, i = 4, trailing edge detected by right sensor Assuming that the positions and velocities of end effector 165 are captured in terms of polar coordinates, as is typically the case in semiconductor manufacturing applications, the Cartesian components of the velocity vectors may be calculated using the following equations:

$$v_{xi} = v_{Ri} \sin \tilde{T}_i + \tilde{R}_i v_{Ti} \cos \tilde{T}_i \quad \text{(Equ. 1)}$$

$$v_{yi} = v_{Ri} \cos \tilde{T}_i - \tilde{R}_i v_{Ti} \sin \tilde{T}_i \quad \text{(Equ. 2)}$$

where $\tilde{R}_i$ and $\tilde{T}_i$ are the captured polar coordinates of a reference point R' on end effector 165, $v_{Ri}$ and $v_{Ti}$ denote the corresponding components of the velocity vector in the polar coordinate system, $v_{xi}$ and $v_{yi}$ are the corresponding cartesian components of the velocity vector, and i=1, 2, 3, 4, where index i refers to four edge detection events, namely i=1 identifies coordinates associated with detection of the leading edge 310 of substrate 215 by sensor 198, i=2 identifies coordinates related to detection of the trailing edge 315 of substrate 215 by sensor 198, i=3 is used to designate coordinates quantities associated with detection of the leading edge 310 of substrate 215 by sensor 197 and i=4 refers to coordinates recorded when trailing edge 315 of substrate 215 is detected by sensor 197. Index i is adopted solely to identify the four edge detection events in terms of the edge and sensor involved, and does not necessarily correspond to the order in which the four edge detection events occur.

Figure 4:
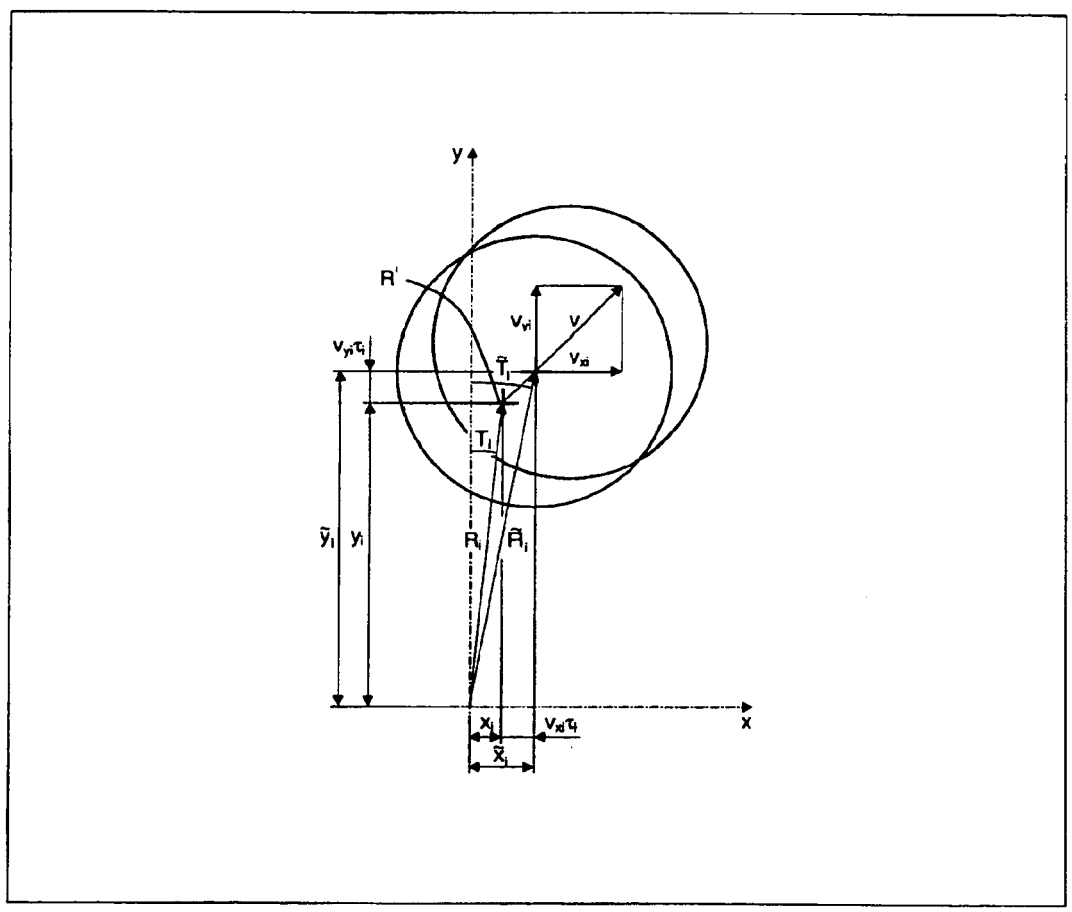
FIG. 4 is a diagram illustrating the determination of estimates of actual Cartesian coordinates of a reference point on a robot end effector from polar coordinates captured by a robot controller.

Turning now to FIG. 4, using the velocity vectors, the Cartesian coordinates of reference point R' on end-effector 165 when the edges of substrate 215 actually enter the field of view of sensors 197, 198 are determined as follows:

$$x_i = \tilde{R}_i \sin \tilde{T}_i - v_{xi}\tau_i \quad \text{(Equ. 3)}$$

$$y_i = \tilde{R}_i \cos \tilde{T}_i - v_{yi}\tau_i \quad \text{(Equ. 4)}$$

where $\tau_i$ are delays associated with the four edge-detection events, i=1, 2, 3, 4.

The Cartesian coordinates are converted to the original polar coordinate system:

$$R_i = \sqrt{x_i^2 + y_i^2} \quad \text{(Equ. 5)}$$

$$T_i = \text{atan } 2(x_i, y_i) \quad \text{(Equ. 6)}$$

where i=1, 2, 3, 4.

The delays $\tau_i$ associated with the signals generated by sensors 197, 198 and with the end effector position capture process can be identified in an automated manner as a part of the calibration routine described below.

Deviation Detection

Deviations from an expected shape of the contour of substrate 215, which may be due to a defect, manufacturing error, or breakage, may be detected provided that such deviations enter the field of view of sensors 197, 198. The end effector position readings reconstructed using the delay compensation techniques described above may be converted into points on a perimeter of substrate 215 that coincide with the locations detected by sensors 197, 198.

The points may then be grouped into trios, each of the trios defining a circle, and the radii of the circles defined by the trios may be calculated. If any of the radii falls outside an interval defined by an expected substrate radius within a predetermined tolerance threshold, it may be determined that the shape of the perimeter of substrate 215 deviates from an expected value, for example because of a defect or breakage.

While the following example utilizes four end effector position readings, it should be understood that more or less than four readings may be used.

Figure 5:
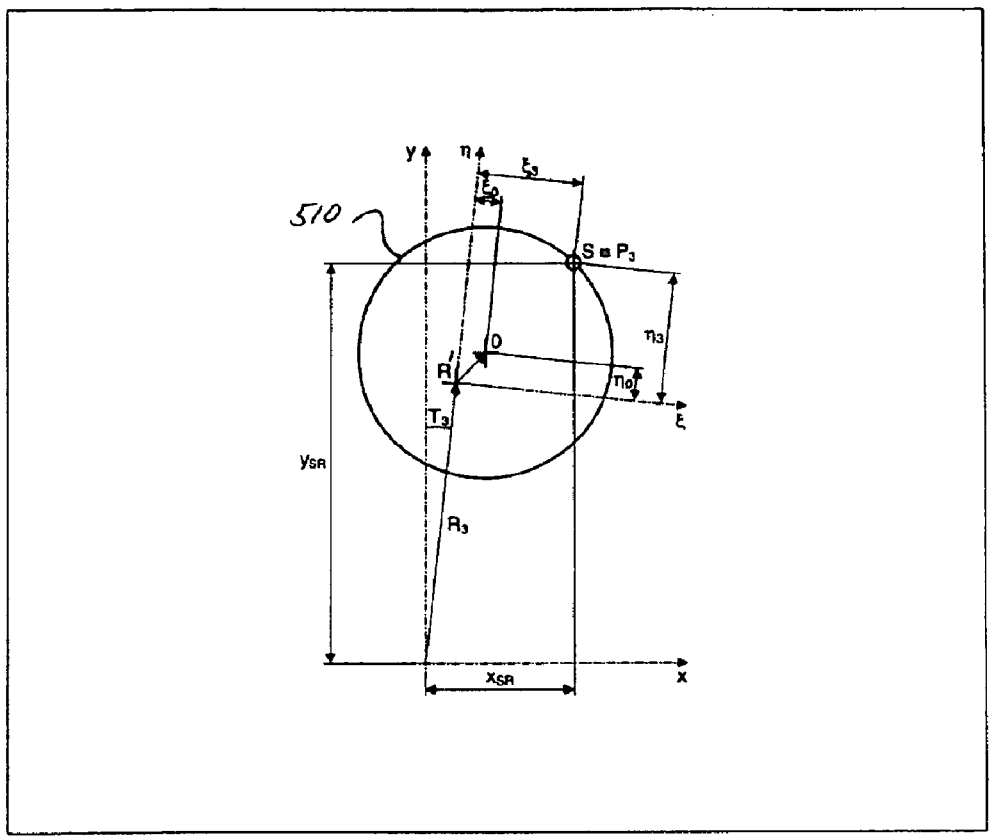
FIG. 5 shows an explanatory diagram for determining a point on a substrate perimeter.

FIG. 5 shows an explanatory diagram for determining a point $P_3$ on substrate perimeter 510. Coordinates of points on substrate perimeter 510 coinciding with the points detected by sensors 197, 198 at the edge detection events 1, 2, 3 and 4, mentioned above, are calculated based on the four end-effector position readings and the coordinates of sensors 197, 198 using the following equations:

$$\xi_1 = x_{SL} \cos T_1 - y_{SL} \sin T_1 \quad \text{(Equ. 7)}$$

$$\eta_1 = x_{SL} \sin T_1 + y_{SL} \cos T_1 - R_1 \quad \text{(Equ. 8)}$$

for point 1 detected at event 1, $$\xi_2 = x_{SL} \cos T_2 - y_{SL} \sin T_2 \quad \text{(Equ. 9)}$$

$$\eta_2 = x_{SL} \sin T_2 + y_{SL} \cos T_2 - R_2 \quad \text{(Equ. 10)}$$

for point 2 detected at event 2, $$\xi_3 = x_{SR} \cos T_3 - y_{SR} \sin T_3 \quad \text{(Equ. 11)}$$

$$\eta_3 = x_{SR} \sin T_3 + y_{SR} \cos T_3 - R_3 \quad \text{(Equ. 12)}$$

for point 3 detected at event 3, and $$\xi_4 = x_{SR} \cos T_4 - y_{SR} \sin T_4 \quad \text{(Equ. 13)}$$

$$\eta_4 = x_{SR} \sin T_4 + y_{SR} \cos T_4 - R_4 \quad \text{(Equ. 14)}$$

for point 4 detected at event 4.

The origin of the $\xi,\eta$-coordinate system coincides with reference point R' on end effector 165 which is the desired location of the actual center O of substrate 215 on end effector 165. The $\eta$-axis coincides with the longitudinal axis of end-effector 165, pointing radially with respect to the origin of the stationary x,y-coordinate system regardless of the ATM robot position. The coordinates of the centers of the lines that connect points 1, 2, 3 and 4 are found as:

$$\xi_{ij} = (\xi_i + \xi_j)/2 \quad \text{(Equ. 15)}$$

$$\eta_{ij} = (\eta_i + \eta_j)/2 \quad \text{(Equ. 16)}$$

where (i,j)=(1,2), (2,3), (3,4), (4,1)

The unit vectors associated with the four lines that connect points 1, 2, 3 and 4 can be expressed as:

$$u_{\xi ij} = (\xi_j - \xi_i)/\sqrt{(\xi_j - \xi_i)^2 + (\eta_j - \eta_i)^2} \quad \text{(Equ. 17)}$$

$$u_{\eta ij} = (\eta_j - \eta_i)/\sqrt{(\xi_j - \xi_i)^2 + (\eta_j - \eta_i)^2} \quad \text{(Equ. 18)}$$

where (i,j)=(1,2), (2,3), (3,4), (4,1).

The normal vectors associated with the four lines that connect points 1, 2, 3 and 4 are then found as:

$$n_{\xi ij} = -u_{\xi ij},\ n_{\eta ij} = u_{\eta ij} \quad \text{(Equ. 19)}$$

where (i,j)=(1,2), (2,3), (3,4), (4,1)

The coefficients of the linear equations that describe the normal lines going through the centers (1,2), (2,3), (3,4), and (4,1) of the four lines are obtained as:

$$a_{ij} = n_{\eta ij}/n_{\xi ij},\ b_{ij} = \eta_{ij} - a_{ij}\xi_{ij} \quad \text{(Equ. 20)}$$

where (i,j)=(1,2), (2,3), (3,4), (4,1).

The coordinates of the centers and the radii of the circles based on the four trios of points 123, 234, 341 and 412 can be calculated as:

$$\xi_{ijk} = (b_{jk} - b_{ij})/(a_{ij} - a_{jk}) \quad \text{(Equ. 21)}$$

$$\eta_{ijk} = (a_{ij}b_{jk} - a_{jk}b_{ij})/(a_{ij} - a_{jk}) \quad \text{(Equ. 22)}$$

$$r_{ijk} = \sqrt{(\xi_i - \xi_{ijk})^2 + (\eta_i - \eta_{ijk})^2} \quad \text{(Equ. 23)}$$

where (i,j,k)=(1,2,3), (2,3,4), (3,4,1), (4,1,2).

The differences between the radii of the four circles and the expected substrate radius are found as:

$$\Delta_{ijk} = |r_{ijk} - r| \quad \text{(Equ. 24)}$$

where (i,j,k)=(1,2,3), (2,3,4), (3,4,1), (4,1,2)

A deviation is detected if any of the differences is greater than a specified threshold $\epsilon_{break}$, i.e., if the following condition is true:

$$(\Delta_{123} > \epsilon_{break}) \vee (\Delta_{234} > \epsilon_{break}) \vee (\Delta_{341} > \epsilon_{break}) \vee (\Delta_{412} > \Delta_{break}) \quad \text{(Equ. 25)}$$

where $\vee$ represents a logical OR operation.

In order to prevent false deviation detection for substrates which exhibit known and expected deviations from a particular shape, such as alignment features, the deviation detection threshold $\epsilon_{break}$ needs to be set to a value greater than the maximum possible $\Delta_{ijk}$ which can result from the presence of such a known feature at the perimeter 510 of substrate 215. If substrate 215 is expected to be of a particular shape, the deviation detection threshold $\epsilon_{break}$ needs to be set above the maximum $\Delta_{ijk}$ associated with a tolerance range of the shape and with tolerances of the edge detection and position capture process.

When a deviation is detected, controller 170 can report an error condition which can be used to abort or otherwise adjust operation of ATM robot 120.

Feature Detection

Features present on perimeter 510 of substrate 215 may also be detected. For purposes of the present invention, a feature may be a known deviation from a substrate perimeter shape, such as an alignment fiducial. It is assumed that the size of such a feature is limited so that no more than one of the four points detected by sensors 197, 198 at perimeter 510 may be affected by the presence of the feature. If the feature, or known deviation, enters the field of view of one of sensors 197, 198, the corresponding end effector position reading needs to be identified and rejected as an invalid point for a subsequent eccentricity calculation described below.

Feature detection may be based on reasoning similar to that employed in the deviation detection technique described above. Using the exemplary points determined above, if all of the radii of the four circles constructed previously for deviation detection purposes fall into the interval defined by an expected substrate shape plus or minus a specified feature detection threshold value, all four position readings are deemed to be valid and may be used for a subsequent substrate eccentricity calculation described below. If this condition is not satisfied, the subsequent eccentricity calculation described below may use three readings only. For example, using four readings, where substrate 215 is circular, the three readings that yield a circle having a radius closest to the nominal radius of substrate 215 are utilized in the eccentricity calculation. The remaining reading will be rejected as an invalid point. These steps may be conveniently implemented using the four $\Delta_{ijk}$ values calculated earlier according to Equation 24. All of the four readings can be used if the following condition is satisfied:

$$(\Delta_{123} < \epsilon_{notch}) \wedge (\Delta_{234} < \epsilon_{notch}) \wedge (\Delta_{341} < \epsilon_{notch}) \wedge (\Delta_{412} < \epsilon_{notch}) \quad \text{(Equ. 26)}$$

where $\wedge$ represents logical AND and $\epsilon_{notch}$ represents a specified feature detection threshold value.

If the above condition is not satisfied, the three readings that yield a minimum $\Delta_{ijk}$ will be taken as valid data points for the subsequent eccentricity calculation. In order to distinguish valid and invalid data, four multipliers $k_1$ to $k_4$ are introduced and set to 1 for the valid readings and to 0 for the invalid reading as shown below:

$$k_1 = 0 \text{ if } \Delta_{234} = \min(\Delta_{123}, \Delta_{234}, \Delta_{341}, \Delta_{412}),\ \text{otherwise } k_1 = 1 \text{ (Equ. 27)}$$

$$k_2 = 0 \text{ if } \Delta_{341} = \min(\Delta_{123}, \Delta_{234}, \Delta_{341}, \Delta_{412}),\ \text{otherwise } k_2 = 1 \text{ (Equ. 28)}$$

$k_3=0$ if $\Delta_{421}=\min(\Delta_{123}, \Delta_{234}, \Delta_{341}, \Delta_{412})$, otherwise $k_3=1$ (Equ. 29)

$k_4=0$ if $\Delta_{123}=\min(\Delta_{123}, \Delta_{234}, \Delta_{341}, \Delta_{412})$ otherwise $k_4=1$ (Equ. 30)

The value of the feature detection threshold $\epsilon_{notch}$ can be determined automatically based on levels of measurement errors and noise as a part of the calibration routine described below. If the feature detection threshold $\epsilon_{notch}$ is too small, the three-reading mode of operation will be used more frequently than necessary. If the threshold $\epsilon_{notch}$ is too large, the feature detection techniques will not reject readings that are partially affected by deviations from the ideal shape of substrate 215 and thus should be rejected.

Recognition of Substrate Eccentricity

Referring again to the example shown in FIG. 5, once a number of valid readings are determined, the location of the actual center O of substrate 215 with respect to its desired position at reference point R' on end-effector 165 may be estimated. The location of the center of a circle with a radius equal to the nominal radius of substrate 215 which best fits the three or four valid points detected by sensors 197, 198 is determined. A least-square fit approach may be selected for this purpose. Mathematically, the objective generally includes finding estimated coordinates, $\xi_0$ and $\eta_0$, of actual center O of substrate 215 so that the following cost function J may be minimized:

$$J = \sum_{i=1}^{4} k_i[(\xi_i - \xi_0)^2 + (\eta_i - \eta_0)^2] \quad \text{(Equ. 31)}$$

This minimization problem can be solved numerically using a gradient-based iterative process. Since actual center O of substrate 215 is expected to be close to its desired position at reference point R' on end effector 165, the iterative process may start at this point:

$\xi_0^{(0)}=0$ (Equ. 32)

$\eta_0^{(0)}=0$ (Equ. 33)

The following steps may be executed repeatedly until the desired accuracy of the location of actual center O of substrate 215 is reached:

$A_i^{(j)}=\sqrt{(\xi_i-\xi_0^{(j)})^2}$, i=1, 2, 3, 4 (Equ. 34)

$$(\partial J/\partial \xi_0)^{(j)} = -2\sum_{i=1}^{4} k_i \frac{A_i^{(j)}-r}{A_i^{(j)}}(\xi_i - \xi_0^{(j)}) \quad \text{(Equ. 35)}$$

$$(\partial J/\partial \eta_0)^{(j)} = -2\sum_{i=1}^{4} k_i \frac{A_i^{(j)}-r}{A_i^{(j)}}(\eta_i - \eta_0^{(j)}) \quad \text{(Equ. 36)}$$

$\xi_0^{(j+1)}=\xi_0^{(j)}-K(\partial J/\partial \xi_0)^{(j)}$ (Equ. 37)

$\eta_0^{(j+1)}=\eta_0^{(j)}-K(\partial J/\partial \eta_0)^{(j)}$ (Equ. 38)

$$J^{(j+1)} = \sum_{i=1}^{4} k_i[(\xi_i - \xi_0^{(j+1)})^2 + (\eta_i - \eta_0^{(j+1)})^2] \quad \text{(Equ. 39)}$$

where K is a coefficient selected so that satisfactory convergence of the iterative process is achieved.

The value of the cost function J calculated in Equation 39 can be used to monitor this process. The calculations may take place repeatedly up to the point when further iterations would not significantly improve the result, i.e., until the following condition is satisfied:

$\sqrt{(\xi_0^{(j)}-\xi_0^{(j-1)})^2+(\eta_0^{(j)}-\eta_0^{(j-1)})^2}<\epsilon$, i=1, 2, 3, 4 (Equ. 40)

where $\epsilon$ is the desired resolution of the result.

Since the origin of the $\xi,\eta$-coordinate system coincides with reference point R' on end effector 165, the estimated coordinates of actual center O of substrate 215, $\xi_0$ and $\eta_0$, define directly the $\xi,\eta$-components of the substrate eccentricity vector.

Compensation for Substrate Eccentricity

Typically, the eccentricity recognition process takes place on the fly while ATM robot 120 extends end effector 165 to place substrate 215 onto station 210, as shown in FIGS. 3A–3F. As mentioned above, adjustments to the ATM robot trajectory, based on the eccentricity vector, may be applied in an on-the-fly manner or may be applied through an additional motion to be executed once the existing trajectory has been completed.

Figure 6:
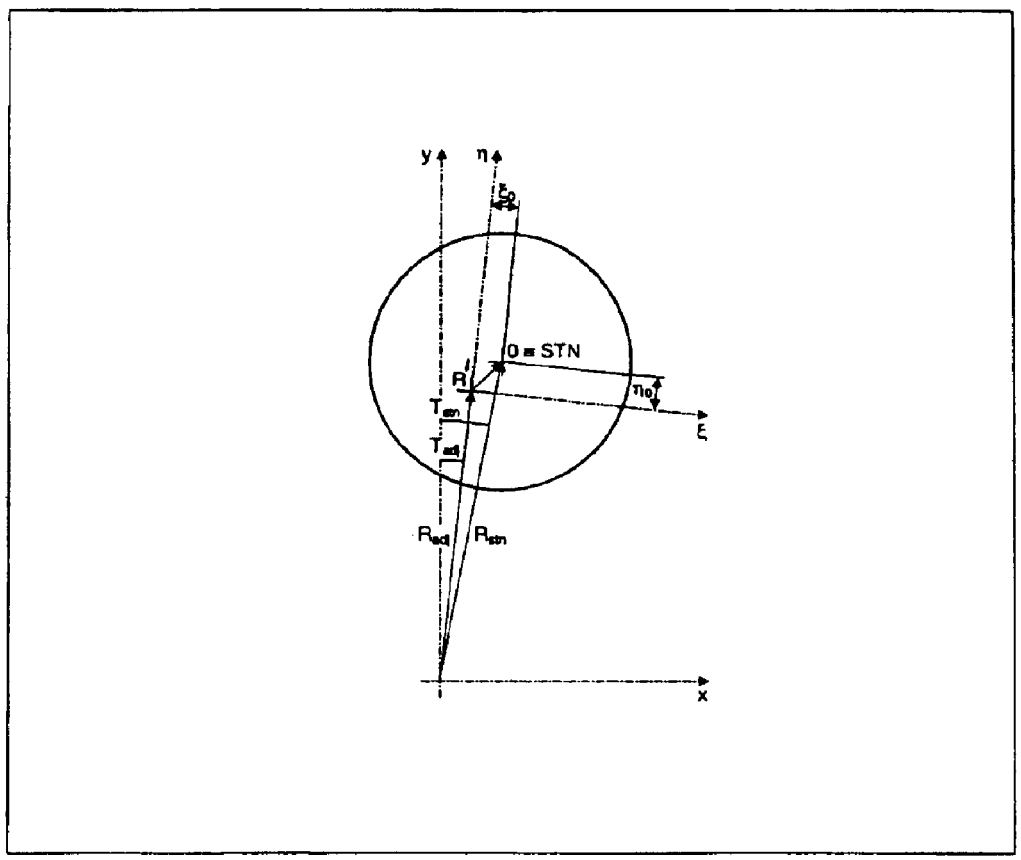
FIG. 6 shows various components of an eccentricity vector for calculating substrate destination adjustments.

FIG. 6 illustrates how the eccentricity vector may be used to calculate the adjustments to the destination position of end-effector 165. The adjusted coordinates of the destination position may be determined from the following equations:

$R_{adj}=\sqrt{R_{stn}^2-\xi_0^2}-\eta_0$ (Equ. 41)

$T_{adj}=T_{stn}-\operatorname{asin}(\xi_0/R_{stn})$ (Equ. 42)

where $R_{stn}$ and $T_{stn}$ are polar coordinates of station 210, and $R_{adj}$ and $T_{adj}$ are polar coordinates of the adjusted destination position of end-effector 165.

Optimization of Sensor Locations

Turning again to FIGS. 3A–3F, the on-the-fly substrate eccentricity recognition techniques of the present invention employ a number of sensors 197, 198 located along transfer path 225 to sense leading edge 310 and trailing edge 315 of substrate 215. As discussed above, when one of leading edge 310 or trailing edge 310 enters the field of view of a sensor 197, 198, the corresponding coordinates of reference point R' of end effector 165 are recorded. In the examples above, four sets of readings are then used to determine the eccentricity of substrate 215 with respect to reference point R' on end effector 165. The possibility of a reading being affected by the presence of a known feature is also taken into account.

Figure 7:
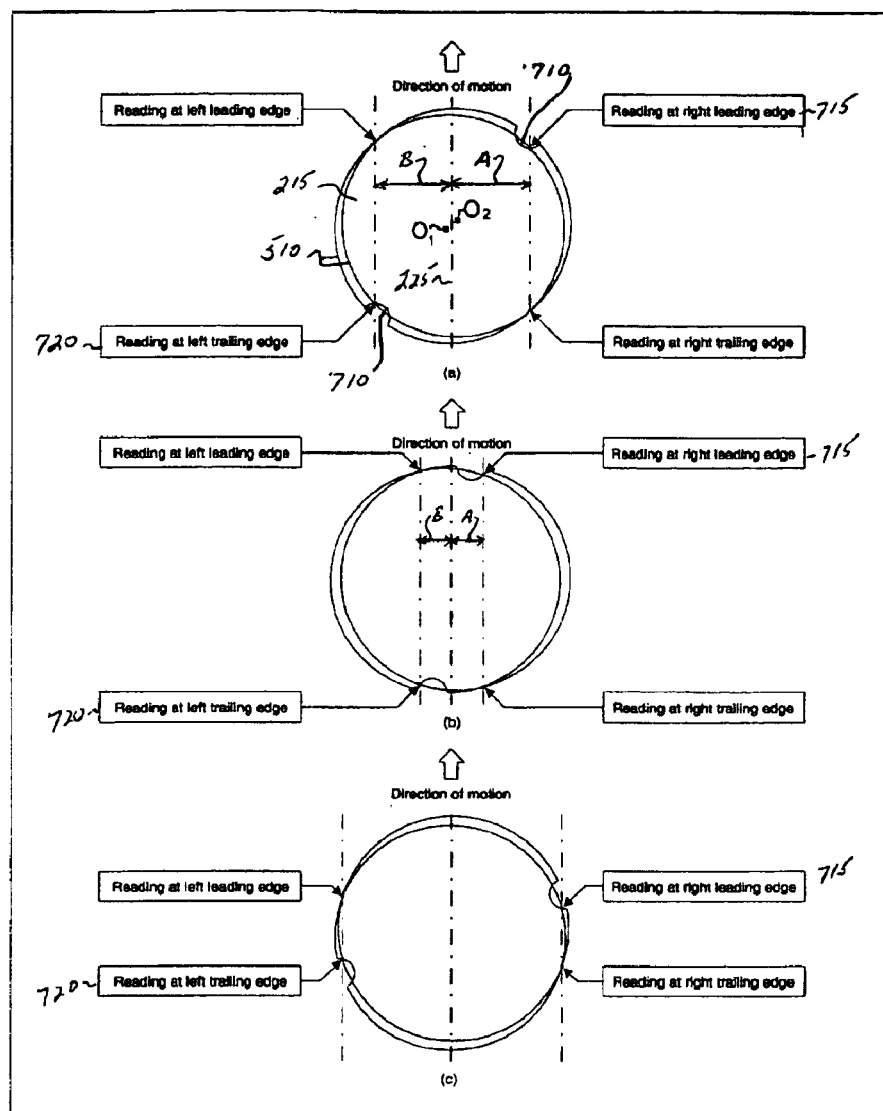
FIG. 7 is a diagram illustrating unresolvable situations that may result from symmetrical sensor placement.

If sensors 197, 198 are located on opposite sides of transfer path 225, and distances A and B (FIG. 2) are equal, different locations of a known feature on perimeter 510 (FIG. 5) may result in identical readings, as illustrated in FIGS. 7A–7C. In these Figures, sensor 197 is located at a distance A from transfer path 225, sensor 198 is located at a distance B from transfer path 225, and distances A and B are equal. The known feature on perimeter 510 may be a notch 710.

As shown in FIG. 7A, the same readings may be obtained when notch 710 is located at the right leading edge 715 and when notch 710 is located at the left trailing edge 720 of substrate 215. As a result, it may be impossible to determine the location of actual center o of substrate 215. It should be understood that this situation may occur regardless of the size of notch 710 or the size of distances A and B. For example, as shown in FIG. 7B, the same problem may exist when distances A and B are smaller than in FIG. 7A, and as shown in FIG. 7C, the same problem may exist when distances A and B are greater than in FIG. 7A.

Figure 8:
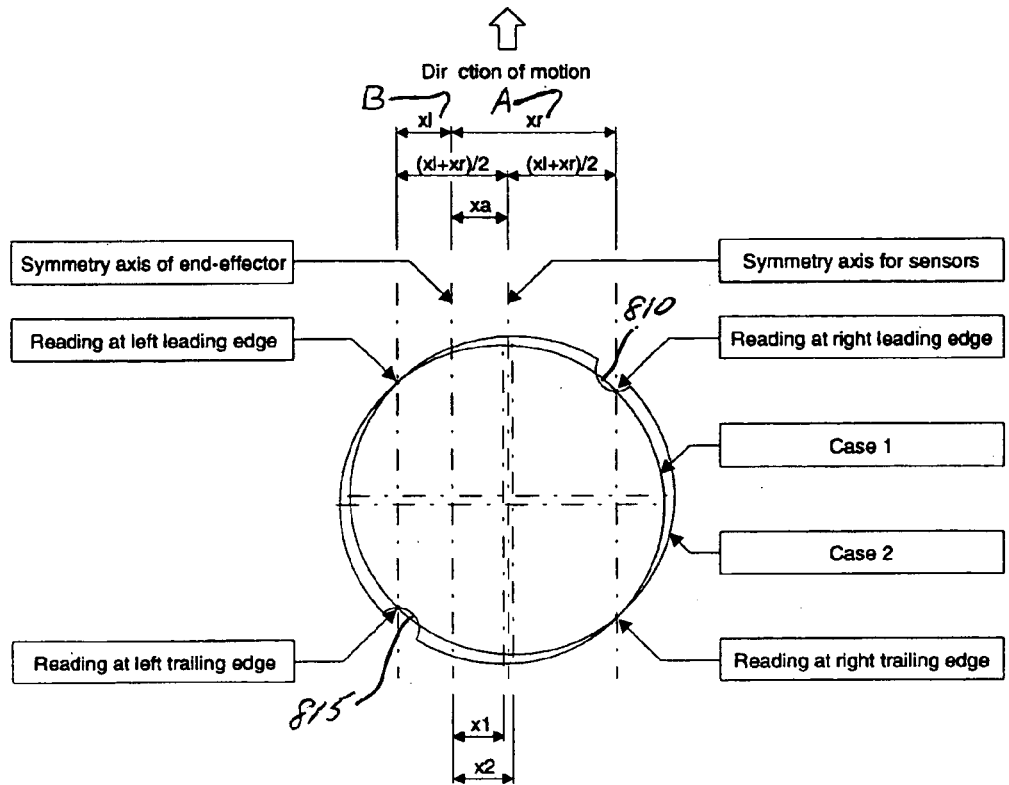
FIG. 8 is a diagram illustrating unresolvable situations that may occur when the sensors are asymmetrically located.
Figure 9:
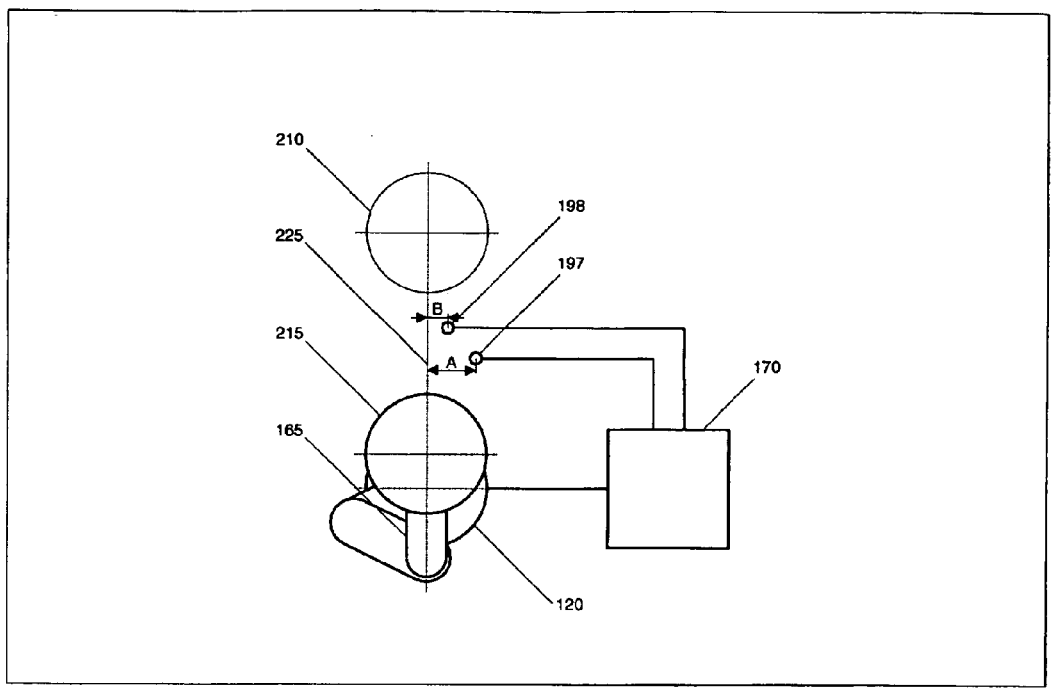
FIG. 9 shows how the sensors may be located on the same side of a transfer path.
Figures 10A, 10B, 10C, 10D, 10E, 10F:
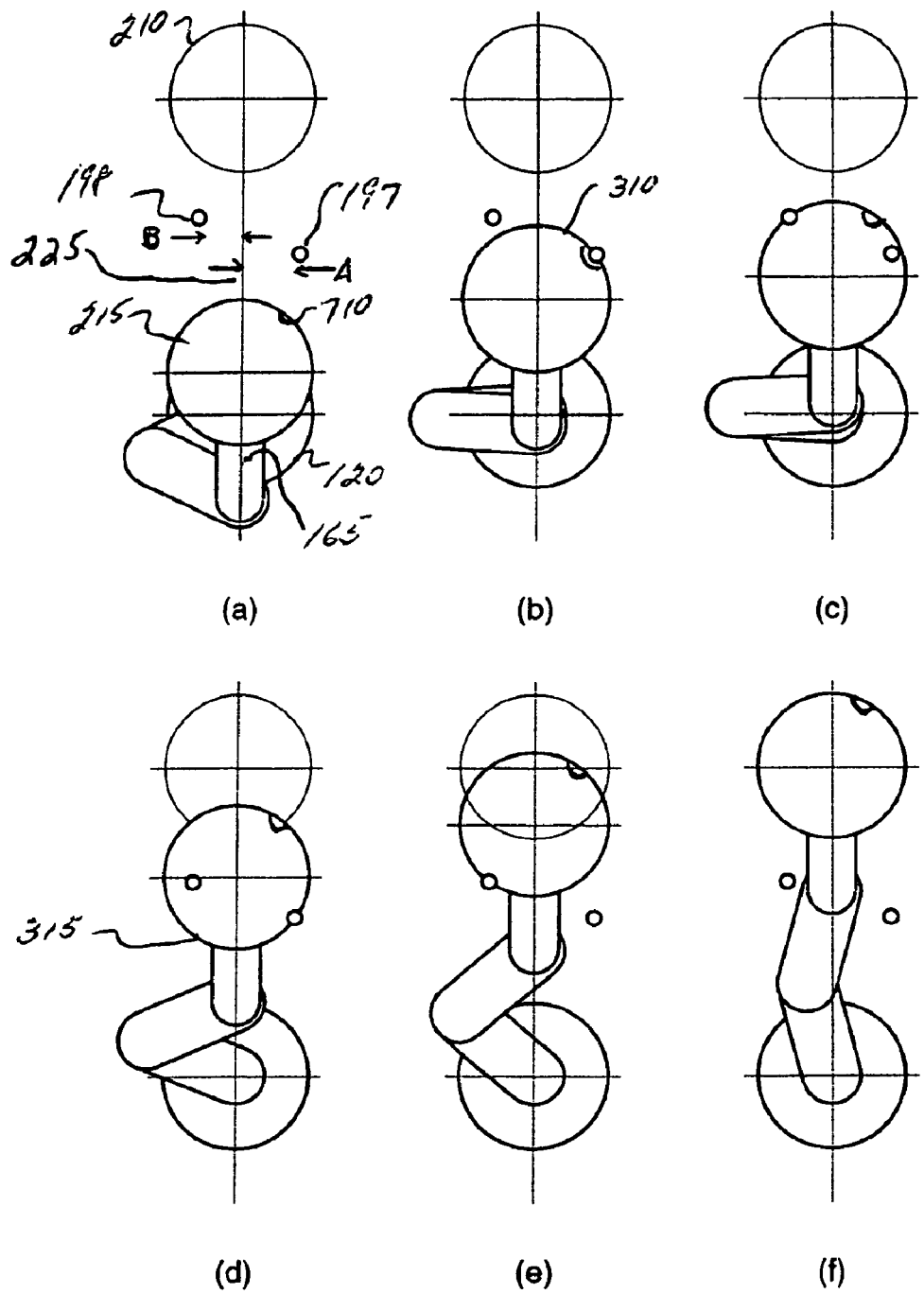
FIGS. 10A–10F are used to illustrate how sensor placement may affect feature detection.

A similar problem may arise even when distances A and B are unequal as is depicted in FIG. 8. FIG. 8 shows that identical readings for two different locations 810, 815 of notch 710 may be obtained if substrate eccentricities, x1 and x2, correspond approximately with the asymmetry of sensors 197, 198, shown as xa. In order to avoid this, the minimum asymmetry of distances A and B should be larger than the maximum expected substrate eccentricity. Alternately, sensors 197, 198 may be mounted on the same side of transfer path 225 as shown in FIG. 9. In this configuration, distances A and B remain unequal.

It is important to note that a larger amount of asymmetry between distances A and B may be required to compensate for deviations of reference point R' of end-effector 165 from transfer path 225. Such deviations may be induced for example by imperfect tracking of motors in ATM robot 120, and may contribute to aliased readings if the locations of sensors 197, 198 do not provide the required amount of asymmetry between distances A and B.

In practice, a substantially large amount of asymmetry between distances A and B may also be required to guard against measurement errors. For the purposes of the present invention, the robustness, or resistance to measurement noise, of the eccentricity determination may be measured through the radii of the four circles that can be constructed using the four readings, each circle being determined by a unique combination of three points out of the four readings, as described above. Three of these radii may be affected by the presence of notch 710. The minimum difference between each of these three radii and the radius of the unaffected circle indicates how well the location of notch 710 may be identified. A larger value of this difference corresponds to better notch identification capability and therefore, better robustness against measurement noise.

As an example, and referring to FIGS. 10A–10F, assume that substrate 215 is a 300-mm wafer with actual center O aligned with reference point R' on end effector 165. Notch 710 is positioned in such a manner that it affects the right leading edge reading (FIG. 10B) by sensor 197 by 1 mm. Sensors 197, 198 are located symmetrically at a distance of 110 mm from transfer path 225. The readings taken when sensor 198 detects the left leading edge (FIG. 10C), when sensor 198 detects the left trailing edge (FIG. 10E), when sensor 197 detects the right leading edge (FIG. 10B), and when sensor 197 detects the right trailing edge (FIG. 10D) are referred to as points 1, 2, 3 and 4, respectively. The radii of the four circles that can be constructed from these points are calculated as follows: r123=149.660 mm, r234=149.659 mm, r341=150.001 mm and r412=150.000 mm. As expected, the value of r412, i.e., the radius of the circle which is defined by points 1, 2 and 4, is not affected by the presence of notch 710. Note that the difference between r341 and r412 is extremely small, indicating limited capability of distinguishing a notch at the right leading edge from a notch at the left trailing edge of the wafer.

For comparison, the locations of sensors 197, 198 may be changed such that distance A=40 mm and distance B=120 mm. In this case, the radii of the four circles are found as r123=149.257 mm, r234=149.571 mm, r341=149.688 mm and r412=150.000 mm. It is observed that the smallest difference between the radii affected by notch 710 and the unaffected radius has increased significantly, thus indicating substantial improvement of robustness over measurement noise. Note that the level of robustness in this example is determined by the configuration of sensors 197, 198 and is independent of the algorithm used to process the data.

It appears that the overall accuracy of eccentricity recognition according to the present invention does not deteriorate due to asymmetry of distances A and B, provided that the distance between sensors 197, 198 is selected properly. In other words, it may be possible to use highly asymmetric sensor locations to achieve desirable feature detection robustness without sacrificing the overall accuracy of eccentricity recognition. The following two observations support this conclusion:

Observation 1.

Assume that sensor 197 is kept fixed while sensor 198 is located at different distances B from transfer path 225. As distance B varies, the angle at which the substrate edge 310 approaches sensor 198 changes with respect to the transfer path direction. This affects the resolution of the sensor reading in the direction along transfer path 225 and in the direction perpendicular to transfer path 225. The resolutions along transfer path 225 and in the direction perpendicular to transfer path 225 become approximately equal when the angle of substrate edge approach is substantially equal to approximately 45 degrees.

As sensor 198 departs from this ideal location, and moves away from transfer path 225, the resolution of the sensor reading in the direction perpendicular to transfer path 225 improves, and the resolution in the direction along transfer path 225 deteriorates. At the same time, however, the eccentricity recognition calculations detailed above become less sensitive to errors in the direction along transfer path 225, making the loss of resolution insignificant.

When sensor 198 moves from the ideal location toward transfer path 225, the resolution of the sensor reading in the direction along transfer path 225 improves, and the resolution in the direction perpendicular to transfer path 225 deteriorates. However, this loss of resolution is accompanied by reduced sensitivity of the eccentricity recognition calculations to reading errors in the direction perpendicular to transfer path 225. Thus, loss of resolution in one direction is accompanied by reduction of sensitivity to sensor reading errors in that direction, making the deteriorated sensor readings less significant.

Observation 2.

If both sensors 197, 198 are moved to a position offset perpendicular to transfer path 225, while keeping the distance between them constant, the loss of resolution of one sensor in a given direction is accompanied by improved resolution of the other sensor in that direction, and vice versa. As a result, the overall accuracy of eccentricity recognition does not change significantly, provided that the distance between sensors 197, 198 is selected properly.

Figure 11A:
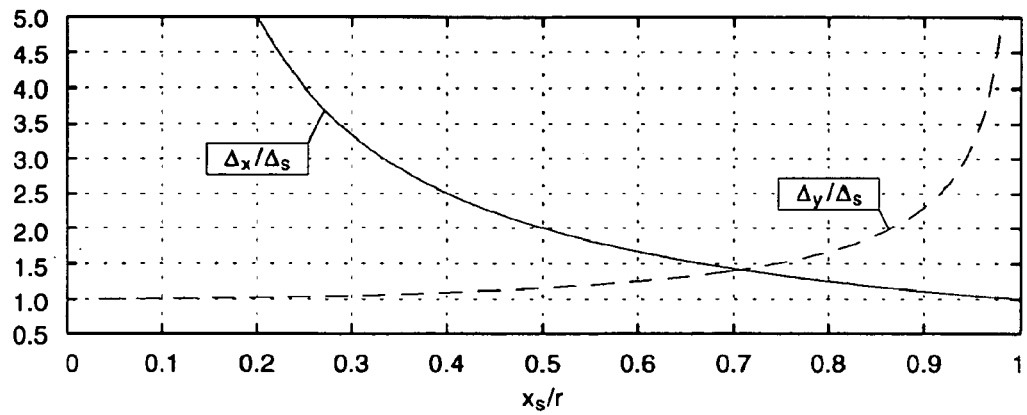
FIG. 11A shows a graph of exemplary sensor reading errors with respect to sensor distance from the transfer path.
Figure 11B:
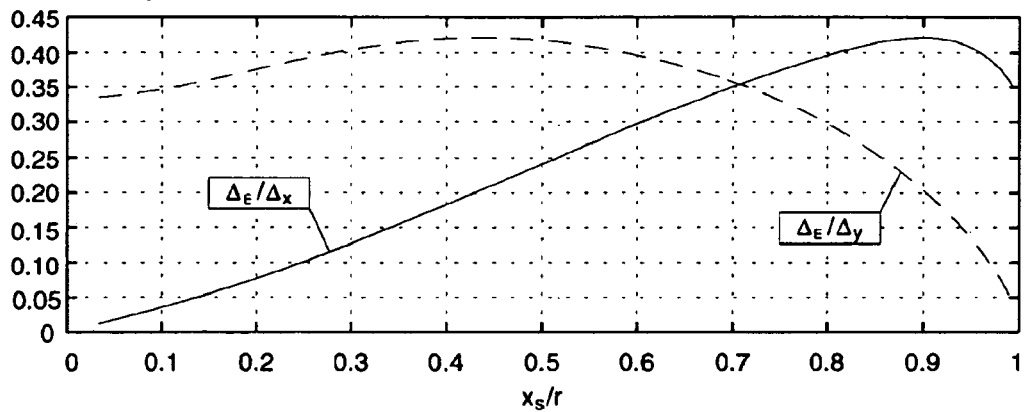
FIG. 11B shows a graph of eccentricity errors due to sensor reading errors with respect to sensor distance from the transfer path.
Figure 12:
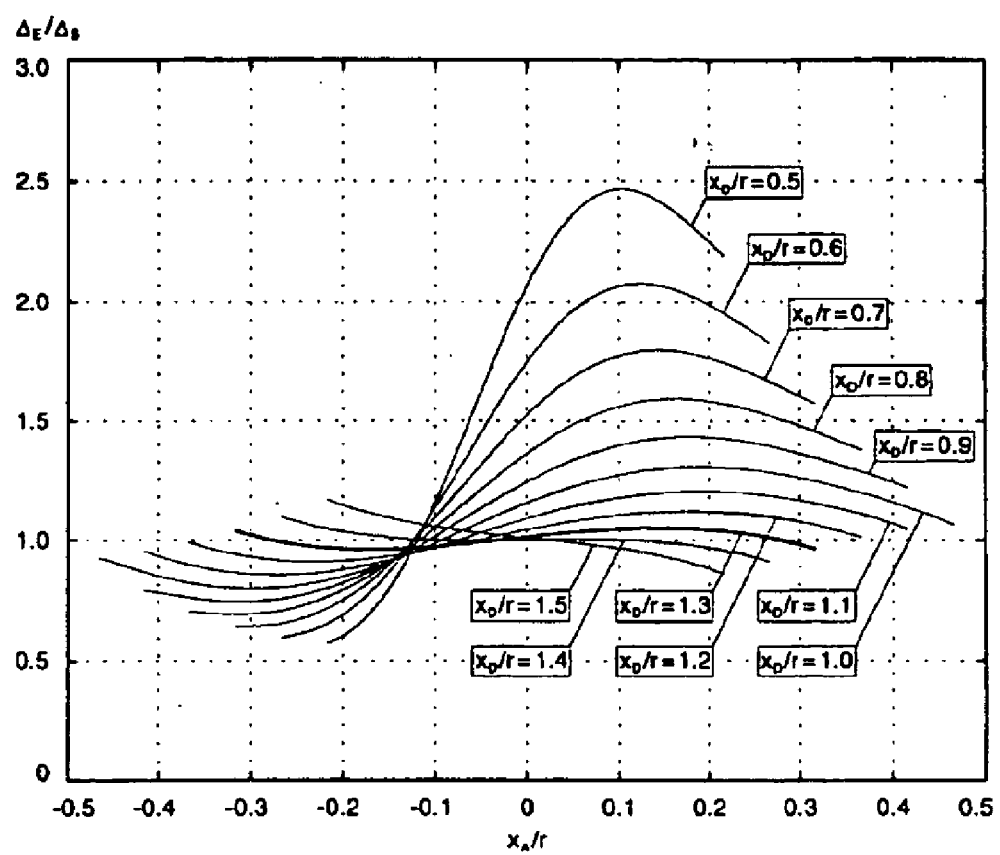
FIG. 12 shows a graph of total eccentricity errors with respect to sensor asymmetry.

Referring to FIGS. 11A, 11B, and 12, the following conventions are adopted: y-coordinates are measured along the direction of transfer path 225, and x-coordinates are measured perpendicular to transfer path 225.

FIG. 11A shows reading errors in the y-direction (dashed) and x-direction (solid) as a function of the distance of sensor 198 from transfer path 225 in accordance with Observation 1 above. It is observed that sensor 198 provides equal resolutions in the x- and y-directions when the distance to transfer path 225 is equal to $[sqrt(2)/2]r$, where r is a radius of substrate 215. This corresponds to approximately 0.7 on the horizontal axis of the graph. In this position of sensor 198, the angle of substrate edge 310 with respect to transfer path 225 is 45 deg, as indicated above.

In FIG. 11B, the dashed line represents total eccentricity error due to reading error in the y-direction, and the solid curve shows total eccentricity error due to reading error in the x-direction. Note that the two curves approach zero as the corresponding graphs in FIG. 11A grow, i.e., the sensitivity of eccentricity recognition to reading errors decreases as the reading error in the corresponding direction increases.

FIG. 12 shows the total eccentricity error as a function of the asymmetry of the distances of sensors 197, 198 from transfer path 225. The results are generated by applying an error to the readings taken for leading edge 310 of substrate 215 as it is detected by sensor 197. It is observed that the distance between sensors 197, 198 may be set to approximately 1.3r in order to minimize sensitivity of the eccentricity error to the level of asymmetry (bold line). For this distance, the error is kept close to the level of the symmetric configuration.

As explained above, sensors 197, 198 should be located in a highly asymmetric manner for feature detection. As shown in FIG. 12, the optimum distance of 1.3r may limit the maximum asymmetric location of the sensors to approximately +/−0.3r.

Automatic Calibration Routine

In order to achieve maximum eccentricity recognition accuracy, the coordinates of sensors 197, 198 should be determined as precisely as possible. Also, the delays associated with the sensor signals and with the position capture process should be identified. Estimates of these delays are utilized for delay compensation as described above. In addition, the level of noise associated with the position capture process may be evaluated as part of setting thresholds for deviation detection and feature detection as described above. These and other operations may be accomplished through an automated calibration routine.

Referring to FIGS. 3A–3F and FIG. 5, the automated calibration routine may begin with substrate 215 placed on end effector 165 such that actual center O (FIG. 5) of substrate 215 substantially coincides with reference point R' (FIG. 5) on end effector 165.

Any features or other known deviations from the expected shape of perimeter 510 of substrate 215 should be oriented to be out of the field of view of sensors 197, 198.

The calibration procedure determines the approximate locations of sensors 197, 198 by moving substrate 215 along transfer path 225 in direction C, through the field of view of sensors 197, 198 at a normal operational speed of ATM robot 120. A number of positions, for example four, of reference point R' on end effector 165 are captured. The positions may be captured when sensor 197 detects leading edge 310 (FIG. 3B), when sensor 198 detects leading edge 310 (FIG. 3C), when sensor 197 detects trailing edge 315 (FIG. 3D), and when sensor 298 detects trailing edge 315 (FIG. 3E). The corresponding velocities of ATM robot 120 are also captured at each of the four exemplary positions.

ATM robot 120 again moves substrate 215 through the field of view of sensors 197, 198 along transfer path 225 in direction C, but at a substantially lower speed. The substantially lower speed is selected so that the distance traveled by ATM robot 120 in a time interval corresponding to delays associated with the signals generated by sensors 197, 198 is smaller than the required position capture accuracy.

As a result, the errors due to the delays in the system associated with signals generated by sensors 197, 198 become negligible. While moving substrate 215 at the substantially lower speed, a number of positions, which continuing with the above example may be four, of reference point R' may be captured when sensors 197, 198 detect the leading and trailing edges 310, 315 of substrate 215. The various detected positions and a known radius of substrate 215 are used to calculate the coordinates of sensors 197, 198. The captured polar coordinates of the end-effector are transformed to the cartesian coordinate system using the following equations:

$$x_{i-Ri} \sin T_i \qquad \text{(Equ. 43)}$$

$$y_{i-Ri} \cos T_i \qquad \text{(Equ. 44)}$$

where i=1, 2, 3, 4.

Figure 13:
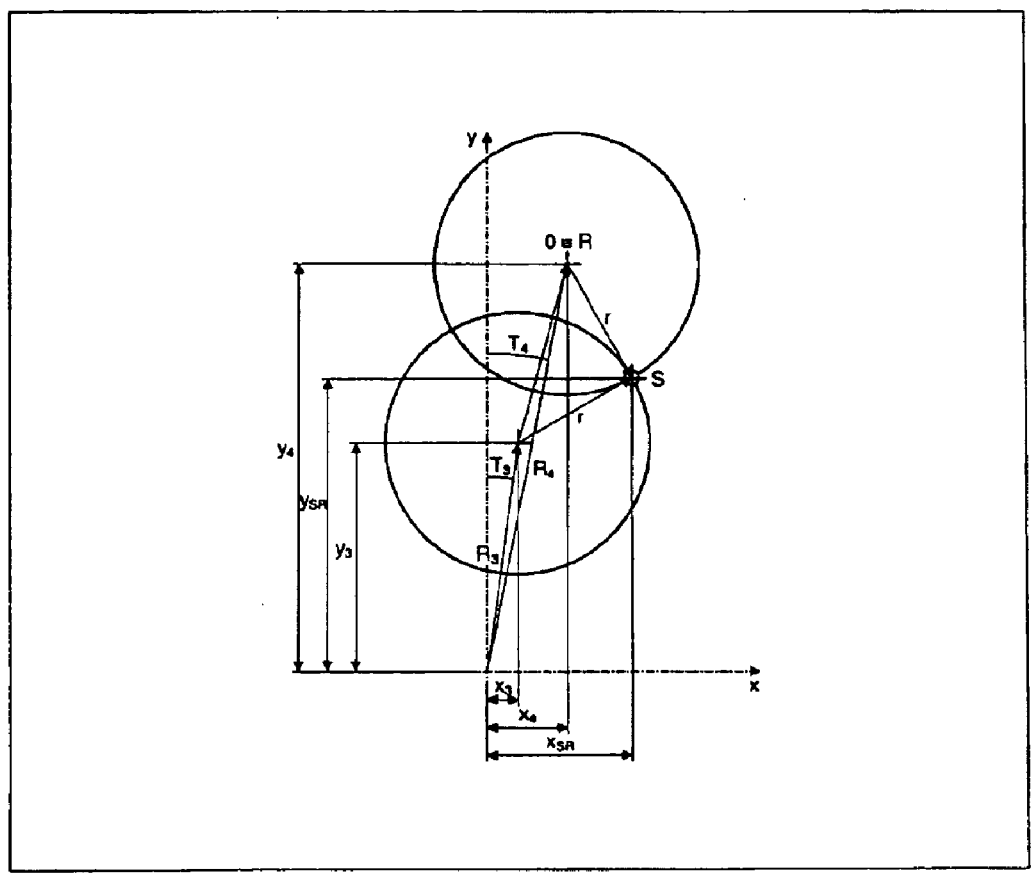
FIG. 13 shows a diagram relating calculated Cartesian coordinates of one of the sensors to two sets of polar coordinates of a robot end-effector captured by a robot controller.

Referring to FIG. 13, the cartesian coordinates of sensor 197 are then calculated based on the following equations:

$$x_{SR}=x_3+a_R \sin \alpha_R+b_R \cos \alpha_R=x_4-a_R \sin \alpha_R+b_R \cos \alpha_R \qquad \text{(Equ. 45)}$$

$$y_{SR}=y_3+a_R \cos \alpha_R-b_R \sin \alpha_R=y_4-a_R \cos \alpha_R-b_R \sin \alpha_R \qquad \text{(Equ. 46)}$$

where:

$$a_R=\sqrt{(x_4-x_3)^2+(y_4-y_3)^2} \qquad \text{(Equ. 47)}$$

$$b_R=\sqrt{r^2-a_R^2} \qquad \text{(Equ. 48)}$$

$$\alpha_R=\operatorname{atan} 2(x_4-x_3,y_4-y_3) \qquad \text{(Equ. 49)}$$

The radius of substrate 215 is denoted as r in Equation 48. A similar set of equations is used to determine the coordinates of sensor 198:

$$x_{SL}=x_1+a_L \sin \alpha_L-b_L \cos \alpha_L=x_2-a_L \sin \alpha_L-b_L \cos \alpha_L \qquad \text{(Equ. 50)}$$

$$y_{SL}=y_1+a_L \cos \alpha_L+b_L \sin \alpha_L=y_2-a_L \cos \alpha_L+b_L \sin \alpha_L \qquad \text{(Equ. 51)}$$

where:

$$a_L=\sqrt{(x_2-x_1)^2+(y_2-y_1)^2}/2 \qquad \text{(Equ. 52)}$$

$$b_L=\sqrt{r^2-a_L^2} \qquad \text{(Equ. 53)}$$

$$\alpha_L=\operatorname{atan} 2(x_2-x_1,y_2-y_1) \qquad \text{(Equ. 54)}$$

The resulting coordinates of sensors 197, 198 along with the positions and velocities captured at normal operational speed of ATM robot 120 can be used for estimation of the delays in the system, i.e., the delays associated with signals generated by sensors 197, 198 and with the subsequent position capture process.

For example, considering the case when leading edge 310 of substrate 215 is detected by sensor 197 (FIG. 3B), the delay associated with the signal generated by sensor 197 is approximately equal to the time it takes reference point R' on end effector 165 to travel from a location where leading edge 310 is detected by sensor 197 to a location where the position of R' is captured. Assuming that end effector 165 maintains substantially the same direction and speed of motion between the two locations, this time can be obtained by reconstructing the motion of the end effector backward to the point where leading edge 310 is detected by sensor 197.

The same approach can be applied to the remaining three cases, i.e., when sensor 198 detects leading edge 310 (FIG. 3C), when sensor 197 detects trailing edge 315 (FIG. 3D), and when sensor 298 detects trailing edge 315 (FIG. 3E).

The four sets of positions and velocities of reference point R' on end effector 165, captured when the leading and trailing edges of the substrate are detected by the two sensors, are transformed to the Cartesian coordinate system first using the following equations:

$$\tilde{x}_i=\tilde{R}_i \sin \tilde{T}_i \qquad \text{(Equ. 55)}$$

$$\tilde{y}_i=\tilde{R}_i \cos \tilde{T}_i \qquad \text{(Equ. 56)}$$

$$v_{xi}=v_{Ri} \sin \tilde{T}_i+\tilde{R}_i v_{Ti} \cos \tilde{T}_i \qquad \text{(Equ. 57)}$$

$$v_{yi}=v_{Ri} \cos \tilde{T}_i-\tilde{R}_i v_{Ti} \sin \tilde{T}_i \qquad \text{(Equ. 58)}$$

where i=1, 2, 3, 4.

The corresponding time delays may then be estimated as follows:

$$\tau_i = (-b_i + \sqrt{b_i^2 - 4a_i c_i})/(2a_i), \quad i=1, 3 \quad \text{(Equ. 59)}$$

$$\tau_i = (-b_i - \sqrt{b_i^2 - 4a_i c_i})/(2a_i), \quad i=2, 4 \quad \text{(Equ. 60)}$$

where:

$$a_i = v_{xi}^2 + v_{yi}^2, \quad i=1, 2, 3, 4 \quad \text{(Equ. 61)}$$

$$b_i = -[2(x_i - x_{SL})v_{xi} + 2(y_i - y_{SL})v_{yi}], \quad i=1, 2 \quad \text{(Equ. 62)}$$

$$b_i = -[2(x_i - x_{SR})v_{xi} + 2(y_i - y_{SR})v_{yi}], \quad i=3, 4 \quad \text{(Equ. 63)}$$

$$c_i = -(x_i - x_{SL})^2 + (y_i - y_{SL})^2 - r^2], \quad i=1, 2 \quad \text{(Equ. 64)}$$

$$c_i = -(x_i - x_{SR})^2 + (y_i - y_{SR})^2 - r^2], \quad i=3, 4 \quad \text{(Equ. 65)}$$

Once the delays are identified, ATM robot 120 may perform a series of pick-place operations at normal operational speed with predetermined substrate eccentricities to assess the level of noise associated with the edge-detection and position-capture process. For each place operation, the four $\Delta_{ijk}$ values defined by Equation 24 are calculated and stored. The resulting information may then be used for automatic setting of the thresholds for deviation detection and feature detection as described below.

If substrate 215 is expected to have a strictly controlled circular shape, the threshold for deviation or defect detection may be set automatically as the maximum $\Delta_{ijk}$ encountered during the calibration pick-place sequence multiplied by a specified safety factor. However, if substrate 215 exhibits known deviations from a strictly controlled circular shape, for example, an alignment fiducial on perimeter 510, the deviation or defect detection threshold may be set to a value greater than the maximum possible $\Delta_{ijk}$ which may result from the presence of such a known feature to prevent false deviation reports.

The threshold for feature detection may be set automatically as the maximum $\Delta_{ijk}$ encountered during the calibration pick-place sequence multiplied by a specified safety factor.

The present invention advantageously provides a dual-sensor configuration for substrate eccentricity detection, with reduced complexity and cost when compared to presently available systems. The present invention includes compensation for signal delays in the system, and also includes substrate deviation detection, that is, detection of unexpected deviations from an expected contour of a substrate. The present invention also includes feature detection to determine whether a known characteristic on the circumference of a substrate enters the field of view of one of the sensors. The present invention further provides for determination of substrate eccentricity and a calibration procedure to automatically determine the locations of the sensors, estimate the delays associated with the sensor signals, and set thresholds for deviation and feature detection.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method of substrate eccentricity detection comprising:

determining at least three positions on a perimeter of a first substrate as the first substrate is moving along a transfer path;

estimating a location of a center of the first substrate as the location of a center of a predetermined circle approximated from the at least three perimeter positions; and determining an eccentricity vector as a difference between the estimated location and a reference position on a substrate transport mechanism on which the first substrate rests.

2. The method of claim 1, wherein determining at least three positions on a perimeter of the first substrate comprises:

capturing a position of the substrate transport mechanism upon detection of each of the at least three points on a perimeter of the first substrate;

utilizing a time delay to compensate the captured mechanism positions for detection delays; and converting the mechanism positions to positions on the perimeter of the first substrate.

3. The method of claim 2, wherein the time delay is determined by:

placing a second substrate with a known radius on the reference position on the substrate transport apparatus;

moving the second substrate through a field of view of a plurality of sensors at a predetermined speed and detecting first positions and first velocities of the substrate transport apparatus when the sensors detect a leading and trailing edge of the second substrate;

moving the second substrate through the field of view of the plurality of sensors at a different predetermined speed and detecting second positions of the substrate transport apparatus when the sensors detect the leading and trailing edge of the second substrate;

calculating the locations of each of the sensors from the second positions and the known radius; and reconstructing the motion of the substrate transport mechanism from the first positions to the second positions using the first velocities and the calculated sensor locations to determine the time delay between the sensors sensing the leading and trailing edges of the second substrate and detecting the first positions of the substrate transport apparatus.

4. The method of claim 3, wherein the time delay is determined by an automatic calibration routine.

5. The method of claim 1, wherein the predetermined circle is approximated by a best fit of the set of the at least three perimeter positions.

6. The method of claim 1, further comprising utilizing the eccentricity vector to correct a trajectory of the substrate transport mechanism.

7. The method of claim 1, further comprising utilizing the eccentricity vector to perform an additional substrate transport mechanism motion after a substrate placement.

8. The method of claim 1, further comprising:

grouping the at least three perimeter positions to define one or more circles; and determining a corresponding radius of each of the one or more circles and detecting a deviation in the first substrate perimeter by determining if any of the corresponding radii exceeds a deviation threshold.

9. The method of claim 8, further comprising reporting an error condition upon detecting the deviation.

10. The method of claim 8, wherein the deviation threshold is determined by:

determining at least three positions on a perimeter of one or more eccentric substrates having a known radius and a predetermined eccentricity;

grouping the at least three perimeter positions to define one or more circles, each circle having a second radius; and setting the deviation threshold to a maximum difference between each second radius and the known radius multiplied by a deviation safety factor.

11. The method of claim 10, wherein the deviation threshold is determined by an automatic calibration routine.

12. The method of claim 1, wherein determining at least three positions on a perimeter of the first substrate comprises:

displacing the first substrate along a path through a field of view of at least two sensors wherein the distance from the path to each of the sensors is asymmetric; and detecting at least two points on a leading edge and at least two points on a trailing edge of the first substrate, and wherein grouping the at least three perimeter positions to define one or more circles comprises grouping the at least two points on the leading edge and the at least two points on the trailing edge in trios to form at least four circles, and wherein the method further comprises detecting a feature of the first substrate perimeter by determining if any first radius of the at least four circles exceeds a feature threshold.

13. The method of claim 12, wherein the set of the at least three perimeter positions comprises three points of the at least two points on the leading edge and the at least two points on the trailing edge that define a first radius that does not exceed the feature threshold.

14. The method of claim 12, wherein determining the feature threshold comprises:

determining at least two positions on a leading edge and at least two positions on a trailing edge of one or more feature substrates, each having a known radius and a predetermined feature;

grouping the at least two positions on a leading edge and at least two positions on a trailing edge in trios to define at least four circles, each circle having a third radius; and setting the feature threshold to a maximum difference between each third radius and the known radius multiplied by a feature safety factor.

15. The method of claim 14, wherein the feature threshold is determined by an automatic calibration routine.

16. A method for determining the eccentricity of a first substrate comprising:

capturing a position of a mechanism upon detection of each of at least three points on a perimeter of the first substrate while the mechanism is transporting and moving the first substrate;

compensating the captured positions for detection delays;

converting the transport mechanism positions to positions on the perimeter of the first substrate;

estimating a location of a center of the substrate as the location of a center of a predetermined circle approximated from the perimeter positions; and determining an eccentricity vector as a difference between the estimated location and a reference position on the substrate transport mechanism.

17. The method of claim 16, further comprising utilizing the eccentricity vector to correct a trajectory of the substrate transport mechanism.

18. The method of claim 16, further comprising utilizing the eccentricity vector to perform an additional substrate transport mechanism motion after a substrate placement.

19. The method of claim 16, further comprising:

grouping the perimeter positions into trios, each trio defining a circle;

calculating a first radius of each circle;

calculating a first difference between each first radius and a known nominal radius; and validating the at least three perimeter positions by comparing each first difference with a threshold.

20. The method of claim 16, further comprising determining at least three positions on a perimeter of one or more eccentric substrates having a known radius and a predetermined eccentricity;

grouping the at least three perimeter positions to define one or more circles, each circle having a second radius;

setting a deviation threshold to a maximum difference between each second radius and the known radius multiplied by a deviation safety factor; and detecting a deviation in the substrate perimeter by determining if any first radius exceeds the deviation threshold.

21. The method of claim 16, further comprising:

determining at least two positions on a leading edge and at least two positions on a trailing edge of one or more feature substrates, each having a known radius and a predetermined feature;

grouping the at least two positions on a leading edge and at least two positions on a trailing edge in trios to define at least four circles, each circle having a third radius;

setting a feature threshold to a maximum difference between each third radius and the known radius multiplied by a feature safety factor; and detecting a feature on the substrate perimeter by determining if any first radius exceeds the feature threshold.

22. A method for determining the eccentricity of a substrate comprising:

moving the substrate through a field of view of one or more sensors to detect at least three points on a perimeter of the substrate;

capturing a position of a mechanism upon detection of each of the at least three points while the mechanism is moving the first substrate;

compensating the captured positions for detection delays;

converting the transport mechanism positions to positions on the perimeter of the substrate;

grouping the perimeter positions into trios, each trio defining a circle;

estimating a location of a center of the substrate as the location of a center of a predetermined circle approximated from the perimeter positions; and determining an eccentricity vector as a difference between the estimated location and a reference position on the substrate transport mechanism.

23. The method of claim 22, wherein displacing the substrate through a field of view of one or more sensors further comprises displacing the substrate in one step between at least a cassette and a load lock of a process chamber.

24. A system for substrate eccentricity detection comprising:

a substrate transport mechanism for transporting a first substrate along a path;

at least one sensor for sensing points on a perimeter of the first substrate as the first substrate is moving along the path; and a controller connected to the substrate transport mechanism and to the at least one sensor, operable to:
  determine at least three positions on the perimeter of the first substrate determined when the at least one sensor detects a perimeter of the first substrate;
  estimate a location of a center of the first substrate as the location of a center of a theoretical circle which is approximated from a set of the at least three perimeter positions; and
  determine an eccentricity vector as a difference between the estimated location and a reference position on the substrate transport mechanism.

25. The system of claim 24, wherein determining at least three positions on the perimeter of the first substrate comprises:
  capturing a position of the substrate transport mechanism upon detection of each of the at least three points on a perimeter of the first substrate;
  utilizing a time delay to compensate the captured mechanism positions for detection delays; and
  converting the mechanism positions to positions on the perimeter of the first substrate.

26. The system of claim 25, wherein determining the time delay comprises:
  placing a second substrate with a known radius on the reference position on the substrate transport apparatus;
  moving the second substrate through the field of view of the plurality of sensors at a normal operational speed and detecting first positions and first velocities of the substrate transport apparatus when the sensors detect a leading and trailing edge of the second substrate;
  moving the second substrate through the field of view of the plurality of sensors at a lower than normal operational speed and detecting second positions of the substrate transport apparatus when the sensors detect the leading and trailing edge of the second substrate;
  calculating the locations of each of the sensors from the second positions and the known radius; and
  reconstructing the motion of the substrate transport mechanism from the first positions to the second positions using the first velocities and the calculated sensor locations to determine the time delay between the sensors sensing the leading and trailing edges of the second substrate and detecting the first positions of the substrate transport apparatus.

27. The system of claim 26, wherein determining the time delay is performed by an automatic calibration routine.

28. The system of claim 24, wherein the controller approximates the center of the theoretical circle using a best fit of the set of the at least three perimeter positions.

29. The system of claim 24, wherein the controller utilizes the eccentricity vector to correct a trajectory of the substrate transport mechanism.

30. The system of claim 24, wherein the controller utilizes the eccentricity vector to perform an additional substrate transport mechanism motion after a substrate placement.

31. The system of claim 24, wherein the controller is further operable to detect a deviation in the first substrate perimeter by grouping the at least three perimeter positions to define one or more circles, each having a first radius, and determining if any first radius exceeds a deviation threshold.

32. The system of claim 31, wherein the controller is operable to report an error condition upon detecting the deviation.

33. The system of claim 31, wherein the controller is operable to determine the deviation threshold by:
  determining at least three positions on a perimeter of one or more eccentric substrates having a known radius and a predetermined eccentricity;
  grouping the at least three perimeter positions to define one or more circles, each circle having a second radius; and
  setting the deviation threshold to a maximum difference between each second radius and the known radius multiplied by a deviation safety factor.

34. The system of claim 33, wherein the controller is operable to determine the deviation threshold by performing an automatic calibration routine.

35. The system of claim 33, wherein the controller is operable to determine at least three positions on a perimeter of the first substrate by:
  causing the substrate transport apparatus to move the first substrate along a path through a field of view of at least two sensors wherein the distance from the path to each of the sensors is asymmetric; and
  detecting at least two points on a leading edge and at least two points on a trailing edge of the first substrate,
and wherein the controller is operable to group the at least two points on the leading edge and the at least two points on the trailing edge in trios to form at least four circles, each having a first radius,
and wherein the controller is further operable to detect a feature of the first substrate perimeter by determining if any first radius of the at least four circles exceeds a feature threshold.

36. The system of claim 35, wherein the set of the at least three perimeter positions comprises three points of the at least two points on the leading edge and the at least two points on the trailing edge that define a first radius that does not exceed the feature threshold.

37. The system of claim 35, wherein the controller is operable to determine the feature threshold by:
  determining at least two positions on a leading edge and at least two positions on a trailing edge of one or more feature substrates, each having a known radius and a predetermined feature;
  grouping the at least two positions on a leading edge and at least two positions on a trailing edge in trios to define at least four circles, each circle having a third radius; and
  setting the feature threshold to a maximum difference between each third radius and the known radius multiplied by a feature safety factor.

38. The system of claim 37, wherein the controller is operable to determine the feature threshold using an automatic calibration routine.

39. A system for substrate eccentricity detection comprising:
  a substrate transport mechanism for moving a substrate along a path;
  at least one sensor having, a centerline positioned eccentric to the path for sensing points on a perimeter of the substrate as the substrate is moving along the path; and
  a controller connected to the substrate transport mechanism and to the at least one sensor, operable to:
    determine at least three positions on a perimeter of the substrate when the at least one sensor detects the perimeter of the first substrate;

estimate a location of a center of the substrate as the location of a center of a theoretical circle with a radius equal to a nominal radius which is approximated by a set of the at least three perimeter positions; and determine an eccentricity vector as a difference between the estimated location and a reference position on the substrate transport mechanism.

* * * * *